United States Patent
Masson et al.

(10) Patent No.: US 9,013,221 B2
(45) Date of Patent: Apr. 21, 2015

(54) LOW-VOLTAGE DIFFERENTIAL SIGNAL RECEIVER CIRCUITRY

(71) Applicant: STMicroelectronics (Grenoble 2) SAS, Grenoble (FR)

(72) Inventors: Thierry Masson, Varces (FR); Sandrine Nicolas, Saint Egreve (FR); Colette Morche, Meylan (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 14/479,795

(22) Filed: Sep. 8, 2014

(65) Prior Publication Data
US 2015/0077166 A1    Mar. 19, 2015

(30) Foreign Application Priority Data
Sep. 17, 2013    (FR) ..................... 13 58930

(51) Int. Cl.
*H03L 5/00* (2006.01)
*H02M 3/06* (2006.01)
*G05F 5/00* (2006.01)

(52) U.S. Cl.
CPC .. *H02M 3/06* (2013.01); *G05F 5/00* (2013.01)

(58) Field of Classification Search
USPC ............. 327/306–333; 361/56, 90, 91.1–91.8
See application file for complete search history.

(56) References Cited

U.S. PATENT DOCUMENTS

| | | | |
|---|---|---|---|
| 5,936,469 A | 8/1999 | Alexander et al. | |
| 6,628,150 B1 * | 9/2003 | Carvajal et al. | 327/108 |
| 7,088,166 B1 | 8/2006 | Reinschmidt et al. | |
| 2006/0066393 A1 * | 3/2006 | Davis et al. | 327/563 |
| 2008/0054953 A1 * | 3/2008 | Chen et al. | 327/108 |
| 2008/0169847 A1 * | 7/2008 | Takenaka | 327/108 |
| 2008/0218292 A1 * | 9/2008 | Park et al. | 333/103 |
| 2009/0160495 A1 * | 6/2009 | Chen et al. | 327/108 |
| 2010/0073036 A1 * | 3/2010 | Takeuchi et al. | 327/108 |
| 2012/0074987 A1 * | 3/2012 | Piepenstock et al. | 327/108 |
| 2012/0161848 A1 * | 6/2012 | Jain | 327/427 |
| 2012/0162189 A1 * | 6/2012 | Ebuchi et al. | 345/212 |
| 2012/0319767 A1 | 12/2012 | Ao Ieong et al. | |

FOREIGN PATENT DOCUMENTS

| | | |
|---|---|---|
| EP | 1434348 A1 | 6/2004 |
| EP | 1688750 A1 | 8/2006 |
| WO | 0135526 A2 | 5/2001 |

OTHER PUBLICATIONS

Texas Instruments Inc., "High Speed Differential Receiver," SGLS309B—Jun. 2005—Revised Apr. 2007, 23 pgs.

\* cited by examiner

*Primary Examiner* — Brandon S Cole
(74) *Attorney, Agent, or Firm* — Allen, Dyer, Doppelt, Milbrath & Gilchrist, P.A.

(57) ABSTRACT

A receiver circuit for a differential input signal, may include a divider bridge having first and second ends, a midpoint therebetween, and intermediate points on either side of the midpoint. The divider bridge is coupled to receive the differential input signal at the first and second ends. A current generator is coupled to the divider bridge and configured to generate compensation currents associated respectively with components of the differential input signal. The divider bridge is configured to receive the compensation currents respectively at the intermediate points, and generate a compensated differential signal between the intermediate points.

23 Claims, 2 Drawing Sheets

LOW-VOLTAGE DIFFERENTIAL SIGNAL RECEIVER CIRCUITRY

TECHNICAL FIELD

The invention relates to the transmission of digital data through differential signals, and more particularly, to a circuit for receiving so-called Low-Voltage Differential Signals (LVDS).

BACKGROUND

LVDS signals typically have a magnitude in the order of one hundred millivolts and are used, for example, in twisted pairs connecting pieces of electronic equipment distant by tens of meters. In such a configuration, the grounds of the pieces of equipment, serving as a reference to the differential signals, generally do not have the same voltage level. As a result, the common-mode of a differential signal arriving at receiver equipment may be outside the range allowed by the equipment's differential signal processing circuitry. For example, the common-mode of the incoming signal may be established at a value in a range of about ten volts, while the processing circuitry is supplied between 0 and 3 V.

Various approaches may be implemented in the processing circuitry to bring the common-mode of the input signal within an allowed range. One approach is to use a divider bridge for each component of the differential input signal, whose division ratio is chosen according to the maximum amplitude of the common-mode and the operating range of the receiver circuit. For example, if the common-mode may vary within a range of ±5 V with respect to the ground of the receiver circuit, and the receiver circuit is supplied with 3 V, each of the divider bridges may be designed with a division ratio of 2, such that the common-mode of the incoming signal does not exceed 2.5 V. However, this approach divides the amplitude of the differential signal by four, typically reducing it to around 25 mV. This reduces the signal to noise ratio and makes the design constraints of the receiving circuit increasingly difficult.

In a common-mode compensation circuit disclosed in U.S. Pat. No. 7,088,166, each component of the incoming differential signal is applied to a respective input of a differential stage through a resistor. A device for regulating the common-mode is designed to pull through each of the resistors a current proportional to the sum of the components, this sum representing the common-mode of the incoming differential signal. Thus, when the common-mode of the incoming signal increases, the current increases in the two resistors simultaneously, which tends to offset the increasing voltage level at the inputs of the differential stage. More specifically, the sum of the components of the incoming signal, produced by a resistor bridge, is applied to the input branch of a current mirror. This mirror has two output branches with the same characteristics, each connected to a respective input of the differential stage.

Ideally, the proportionality factor is set so that the voltage drop caused by the current in each resistor is equal to the difference of the common-mode input signal relative to a reference level of the receiver circuit. In this case, the common-mode of the inputs of the differential stage remains at the reference level, regardless of the common-mode of the incoming signal. This setting is approximate in practice because it depends on many parameters such as the supply voltage, the temperature, and the process technology used to manufacture the circuit.

SUMMARY

Thus a device that can compensate the common-mode of a differential signal independently of parameters that are difficult to control may be desirable. This desire is addressed by providing a receiver circuit for a differential input signal that includes a divider bridge connected to receive the differential input signal between its ends. The divider bridge has a midpoint. The receiver circuit includes a current generator connected to produce, based on the level of the signal at the midpoint of the divider bridge, two compensation currents associated respectively with the two components of the differential input signal. The divider bridge includes two intermediate points on either side of the midpoint to which the two compensation currents are respectively provided, and between which a compensated differential signal is taken.

According to an embodiment, the current generator is configured to integrate the variation of the common-mode of the compensated differential signal relative to a reference level. According to an embodiment, the current generator may include a differential amplifier connected to the midpoint of the divider bridge in an integrator configuration, and receive the reference level on a non-inverting input. The current generator may also include transconductors controlled by the differential amplifier, and respectively producing the two compensation currents.

According to an embodiment, the divider bridge may be resistive and may include capacitive elements configured to compensate for a bandwidth decrease of the circuit caused by parasitic capacitances affecting the intermediate points of the divider bridge. According to an embodiment, the divider bridge may include four series resistors, connected respectively between a first end of the divider bridge and a first of the intermediate points, between the first intermediate point and the midpoint, between the midpoint and the second intermediate point, and between the second intermediate point and the second end of the divider bridge. According to an embodiment, the distal resistors of the divider bridge may have the same value, and the central resistors may have a same value greater than the value of the distal resistors.

DESCRIPTION OF THE EMBODIMENTS

The common-mode compensation device disclosed in U.S. Pat. No. 7,088,166 in fact operates in an open loop mode. It is therefore unable to cope with unexpected variations of certain parameters, such as temperature, supply voltage, and the manufacturing process.

Figure 1:
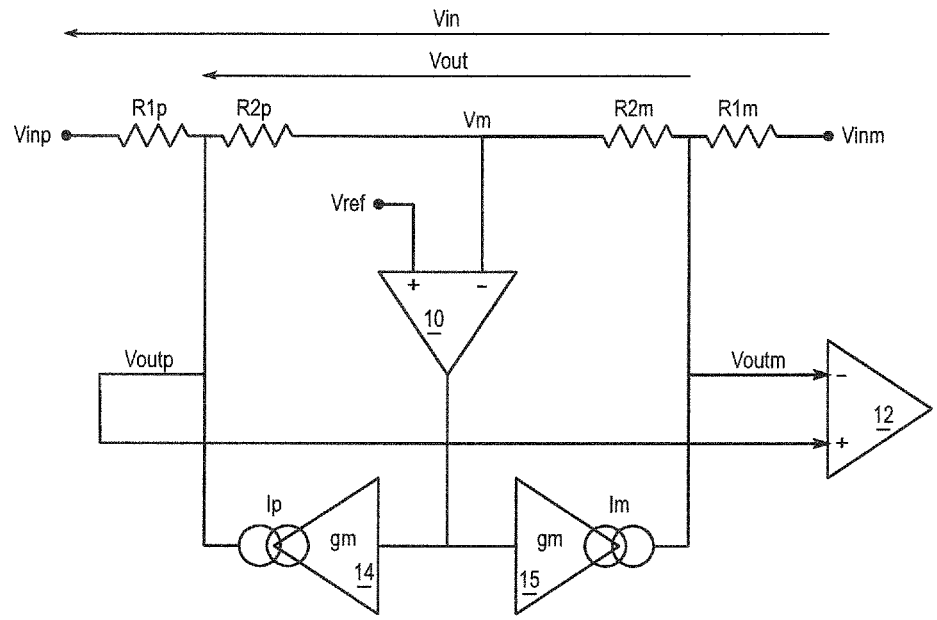
FIG. 1 is a schematic diagram of a common-mode control device operating in a closed loop according to an embodiment.

FIG. 1 schematically shows an embodiment of a common-mode compensation device operating in a closed-loop mode. The differential input signal Vin, having two components Vinp and Vinm, is applied across a divider bridge formed by four resistors, successively R1$p$, R2$p$, R2$m$ and R1$m$. The midpoint of the bridge is formed between the resistors R2$p$ and R2$m$. The connection node between the resistors R1$p$ and R2p forms a first intermediate output of the bridge, providing a first component Voutp of a compensated differential signal Vout. The connection node between the resistors R1m and R2m forms a second intermediate output of the bridge, providing the second component Voutm of the compensated differential signal Vout.

Preferably, resistors Rip and Rim are equal to a value R1, and resistors R2p and R2m are equal to a value R2. Then, the voltage Vm at the midpoint of the bridge represents the common-mode $Vcm_{out}$ of the compensated differential signal Vout, since resistors R2p and R2m produce the average value of components Voutp and Voutm. Without other influences on the divider bridge, the voltage Vm is also the common-mode Vcmin of the differential input signal $V_{in}$.

The components Voutp and Voutm may be applied to the inputs of a differential stage 12 for subsequent processing. The ratio between the compensated differential signal Vout and the input differential signal Vin is R2/(R1+R2). Preferably, to minimize the attenuation, the value R2 is selected to be large relative to the value R1.

A differential amplifier 10 receives the voltage Vm at the midpoint of the bridge on its inverting input and receives a reference level Vref on its non-inverting input. The amplifier 10 applies the amplified difference Vref−Vm to the inputs of two transconductors 14 and 15, preferably having a same transconductance coefficient gm. The output currents Ip and Im of transconductors 14 and 15 are respectively applied to the intermediate nodes Voutp and Voutm of the divider bridge.

With this configuration, in an ideal situation where the common-mode of the input signal Vin and the common-mode of the compensated signal Vout are equal, Vm and Vref assume the same steady state value. The output of the amplifier 10 is zero so that the currents Ip and Im are zero. No current is derived from the divider bridge.

An increase of the common-mode of the input signal Vin leads to an increase of the signal Vm. Then, the output of amplifier 10 becomes negative, and the transconductors 14 and 15 respond by producing negative currents Ip and Im, i.e. currents drawn through the resistors R1p and R1m. The currents Ip and Im thus increase the voltage drop across each of resistors R1p and R1m, whereby the voltage of nodes Voutp and Voutm is lowered, simultaneously lowering the midpoint voltage Vm. If the amplifier 10 has infinite gain, the currents Ip and Im reach a value such that the voltage Vm stabilizes again to level Vref. This configuration thus achieves a closed-loop common-mode compensation, and more specifically a regulation to level Vref of the common-mode Vcmout of the compensated differential signal.

The transconductors 14 and 15 may provide positive currents (outgoing) and negative currents (ingoing) to compensate for negative and positive common-modes. For this purpose, the transconductors are preferably of class AB. They may comprise a common input stage receiving the output of the amplifier 10, and two output branches of same characteristics controlled by the common input stage.

In practice, the components of the differential input signal Vin are not perfectly symmetrical, so that the average of the components is not a DC voltage and exhibits spurious variations around the common-mode. To reduce these spurious variations from affecting the compensation, they could be filtered out with a low-pass filter, for example by connecting a capacitor between the midpoint of the bridge and ground.

Figure 2:
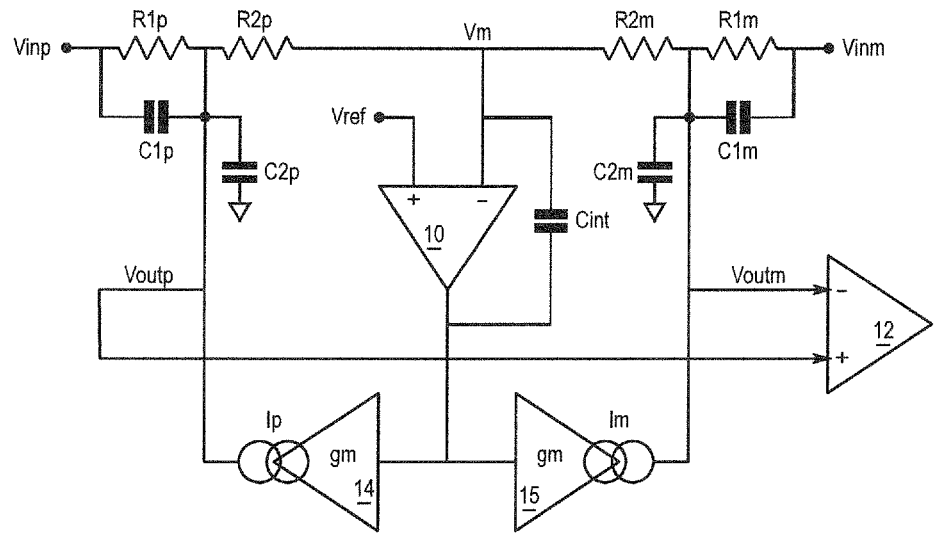
FIG. 2 is a schematic diagram of a common-mode control device operating in a closed loop according to another embodiment.

FIG. 2 illustrates an embodiment of the compensation device. The amplifier 10 of FIG. 1 is connected as an integrator with resistors R2p and R2m. A capacitor Cint is connected between the inverting input and the output of the amplifier. With this configuration, the integrator follows sustained changes of the common-mode DC level. More specifically, assuming that the amplifier 10 has an infinite gain, and R1 is small compared to R2, the common-mode Vcmout of the compensated signal is expressed in transient mode by:

$$Vcm_{out} \approx Vcm_{in} \frac{pCint}{pCint + \frac{R1}{gmR2}} + Vref$$

where p is the Laplace operator. The term pCInt tends to 0 with time. Thus, the voltage $Vcm_{out}$ again tends to level Vref whenever it undergoes a variation due to a sustained change in the common-mode $Vcm_{in}$ of the input signal.

The outputs of the transconductors 14 and 15 and the inputs of the differential stage 12 have a capacitive impedance which tends to form a low-pass filter with resistors R1p and R1m. This would cause an additional attenuation of the differential signal Vout at higher frequencies. To avoid this phenomenon, as shown, resistors R1p and R1m may be bypassed by respective capacitors C1p and C1m forming high-pass filters. The values of these capacitors are chosen to compensate for the attenuation caused by the parasitic capacitances on nodes Voutp and Voutm.

To maintain the division ratio of the bridge at high frequencies, the parasitic capacitances may be corrected by connecting capacitors C2p and C2m between the outputs of the transconductors and ground. These capacitors increase the parasitic capacitances in a controlled manner. The values of capacitors C1p and C1m are adjusted accordingly.

For example, resistors R1p and R1m may have a value of 100 KOhm, and the resistors R2p and R2m a value of 800 KOhm. A current range of ±50 µA supplied by the transconductors may then compensate a common-mode deviation of ±5 V. The capacitors Cint, C1p, and C1m may then have a value of 8 pF, and capacitors C2p and C2m a value of 1 pF.

Figure 3:
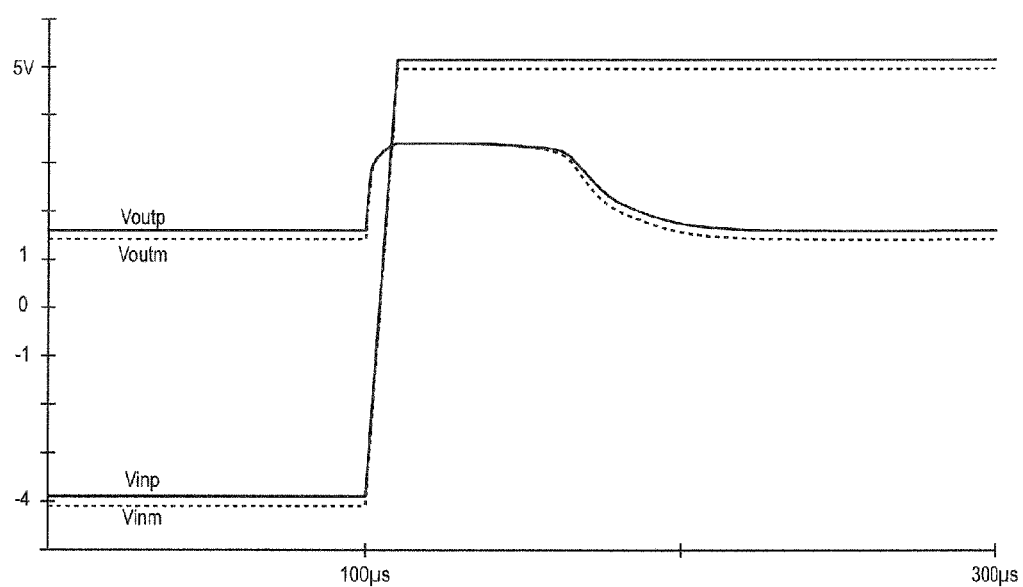
FIG. 3 is a graph illustrating an exemplary transient response of the device of FIG. 2 versus a variation of the common-mode of the differential input signal.

FIG. 3 is a graph illustrating an exemplary response of the device of FIG. 2 to a change in the common-mode of the differential input signal. The component values are those indicated above by way of example. In addition, it is assumed that the device's supply voltage is 3 V, and the level Vref is 1.5 V.

Initially, the common-mode Vcmin of the differential input signal is −4 V. The differential signal is shown with a DC amplitude of about 100 mV so that the component Vinp, shown in solid lines, is about −3.95 V, and the component Vinm, shown in dotted lines, is about −4.05 V. The compensated differential signal Vout has a common-mode established at Vref=1.5V—its components Voutp and Voutm are about 1.55 V and 1.45 V. Currents Ip and Im are at 40 µA.

At 100 microseconds, the common-mode of the input signal undergoes a 9 V step with a rise time of 10 microseconds. The components Voutp and Voutm of the compensated differential signal instantaneously follow this variation and clip at a threshold of approximately 3.5 V, defined above the supply voltage by an overvoltage protection circuit, not shown. The integrator starts reacting at about one third of the rise time, but does not react quickly enough to immediately compensate the variation of the common-mode. After about 60 microseconds, the integrator reacts faster and gradually reduces the common-mode of the signal Vout to the value Vref. The compensation currents Ip and Im establish at −50 uA.

The variation of the common-mode of the input signal in this graph was chosen with exaggerated amplitude to demonstrate the effectiveness of the circuit under extreme conditions. In reality, the common-mode varies little and slowly after the transmitter and receiver pieces of equipment have been connected so that the regulation occurs without distorting the compensated differential signal.

What is claimed is:

1. A receiver circuit for a differential input signal, comprising:
    a divider bridge having first and second ends, a midpoint therebetween, and a plurality of intermediate points on either side of the midpoint, said divider bridge coupled to receive the differential input signal at the first and second ends; and
    a current generator coupled to said divider bridge and configured to generate a plurality of compensation currents based upon a signal at the midpoint, the plurality of compensation currents being associated respectively with a plurality of components of the differential input signal, said current generator comprising
        a differential amplifier coupled to the midpoint in an integrator configuration, having an input, and configured to receive a reference level on the input, and
        a plurality of transconductors configured to be controlled by the differential amplifier and generate the plurality of compensation currents;
    said divider bridge being configured to receive the plurality of compensation currents respectively at the plurality of intermediate points, and generate a compensated differential signal between the plurality of intermediate points.

2. The receiver circuit of claim 1, wherein said current generator is configured to integrate a variation of a common-mode of the compensated differential signal relative to the reference level.

3. The receiver circuit of claim 1, wherein said divider bridge is resistive and comprises a plurality of capacitive elements configured to compensate for a bandwidth decrease of the receiver circuit caused by parasitic capacitances affecting the plurality of intermediate points.

4. The receiver circuit of claim 1, wherein said divider bridge comprises four resistors coupled in series, and coupled respectively between the first end and a first one of the plurality of intermediate points, between the first one of the plurality of intermediate points and the midpoint, between the midpoint and a second one of the plurality of intermediate points, and between the second one of the plurality of intermediate points and the second end.

5. The receiver circuit of claim 4, wherein distal ones of the four resistors have a same value, and central ones of the four resistors have a same value greater than the value of the distal resistors.

6. A receiver circuit for a differential input signal, comprising:
    a divider bridge having first and second ends, a midpoint therebetween, and a plurality of intermediate points between the midpoint and the first and second ends, said divider bridge configured to receive the differential input signal at the first and second ends; and
    a current generator coupled to said divider bridge and configured to generate a plurality of compensation currents based upon a signal at the midpoint, said current generator comprising
        a differential amplifier coupled to the midpoint in an integrator configuration, having an input, and configured to receive a reference level on the input, and
        a plurality of transconductors configured to be controlled by the differential amplifier and generate the plurality of compensation currents;
    said divider bridge being configured to receive the plurality of compensation currents respectively at the plurality of intermediate points, and generate a compensated differential signal between the plurality of intermediate points based upon the plurality of compensation currents.

7. The receiver circuit of claim 6, wherein said current generator is configured to integrate a variation of a common-mode of the compensated differential signal relative to the reference level.

8. The receiver circuit of claim 6, wherein said divider bridge comprises a plurality of capacitive elements coupled respectively to said plurality of intermediate points.

9. The receiver circuit of claim 6, wherein said divider bridge comprises a plurality of series coupled resistors, a first one of said plurality of series coupled resistors coupled between the first end and a first one of the plurality of intermediate points, a second one of said plurality of series coupled resistors coupled between the first one of the plurality of intermediate points and the midpoint, a third one of said plurality of series coupled resistors coupled between the midpoint and a second one of the plurality of intermediate points, and a fourth one of said plurality of series coupled resistors coupled between the second one of the plurality of intermediate points and the second end.

10. The receiver circuit of claim 9, wherein distal ones of said plurality of series coupled resistors have a same value, and central ones of the plurality of series coupled resistors have a same value greater than the value of the distal resistors.

11. A method of generating a compensated differential signal in a receiver circuit comprising a divider bridge having first and second ends, a midpoint therebetween, and a plurality of intermediate points between the midpoint and the first and second ends, the method comprising:
    generating, using a current generator coupled to the divider bridge, a plurality of compensation currents based upon a signal at the midpoint, the current generator comprising a differential amplifier coupled to the midpoint in an integrator configuration and receiving a reference level on an input, and a plurality of transconductors controlled by the differential amplifier and generating the plurality of compensation currents; and
    generating the compensated differential signal across the plurality of intermediate points and based upon the plurality of compensation currents provided respectively at the plurality of intermediate points.

12. The method of claim 11, wherein the current generator integrates a variation of a common-mode of the compensated differential signal relative to the reference level.

13. The method of claim 11, wherein the divider bridge comprises a plurality of capacitive elements coupled respectively to the plurality of intermediate points.

14. The method of claim 11, wherein the divider bridge comprises a plurality of series coupled resistors, a first one of the plurality of series coupled resistors coupled between the first end and a first one of the plurality of intermediate points, a second one of the plurality of series coupled resistors coupled between the first one of the plurality of intermediate points and the midpoint, a third one of the plurality of series coupled resistors coupled between the midpoint and a second one of the plurality of intermediate points, and a fourth one of the plurality of series coupled resistors coupled between the second one of the plurality of intermediate points and the second end.

15. The method of claim 14, wherein distal ones of the plurality of series coupled resistors have a same value, and central ones of the plurality of series coupled resistors have a same value greater than the value of the distal resistors.

16. A receiver circuit for a differential input signal, comprising:
- a divider bridge having first and second ends, a midpoint therebetween, and a plurality of intermediate points between the midpoint and the first and second ends, said divider bridge configured to receive the differential input signal at the first and second ends and comprising a plurality of capacitive elements coupled respectively to the plurality of intermediate points; and
- a current generator coupled to said divider bridge and configured to generate a plurality of compensation currents based upon a signal at the midpoint;
- said divider bridge being configured to receive the plurality of compensation currents respectively at the plurality of intermediate points, and generate a compensated differential signal between the plurality of intermediate based upon the plurality of compensation currents.

17. The receiver circuit of claim 16, wherein said current generator is configured to integrate a variation of a common-mode of the compensated differential signal relative to a reference level.

18. The receiver circuit of claim 16, wherein said divider bridge comprises a plurality of series coupled resistors, a first one of said plurality of series coupled resistors coupled between the first end and a first one of the plurality of intermediate points, a second one of said plurality of series coupled resistors coupled between the first one of the plurality of intermediate points and the midpoint, a third one of said plurality of series coupled resistors coupled between the midpoint and a second one of the plurality of intermediate points, and a fourth one of said plurality of series coupled resistors coupled between the second one of the plurality of intermediate points and the second end.

19. The receiver circuit of claim 18, wherein distal ones of said plurality of series coupled resistors have a same value, and central ones of the plurality of series coupled resistors have a same value greater than the value of the distal resistors.

20. A method of generating a compensated differential signal in a receiver circuit comprising a divider bridge having first and second ends, a midpoint therebetween, and a plurality of intermediate points between the midpoint and the first and second ends, the bridge divider comprising a plurality of capacitive elements coupled respectively to the plurality of intermediate points, the method comprising:
- generating, using a current generator coupled to the divider bridge, a plurality of compensation currents based upon a signal at the midpoint; and
- generating the compensated differential signal across the plurality of intermediate points and based upon the plurality of compensation currents provided respectively at the plurality of intermediate points.

21. The method of claim 20, wherein the current generator integrates a variation of a common-mode of the compensated differential signal relative to a reference level.

22. The method of claim 20, wherein the divider bridge comprises a plurality of series coupled resistors, a first one of the plurality of series coupled resistors coupled between the first end and a first one of the plurality of intermediate points, a second one of the plurality of series coupled resistors coupled between the first one of the plurality of intermediate points and the midpoint, a third one of the plurality of series coupled resistors coupled between the midpoint and a second one of the plurality of intermediate points, and a fourth one of the plurality of series coupled resistors coupled between the second one of the plurality of intermediate points and the second end.

23. The method of claim 22, wherein distal ones of the plurality of series coupled resistors have a same value, and central ones of the plurality of series coupled resistors have a same value greater than the value of the distal resistors.

* * * * *

UNITED STATES PATENT AND TRADEMARK OFFICE
CERTIFICATE OF CORRECTION

PATENT NO. : 9,013,221 B2  Page 1 of 1
APPLICATION NO. : 14/479795
DATED : April 21, 2015
INVENTOR(S) : Masson et al.

It is certified that error appears in the above-identified patent and that said Letters Patent is hereby corrected as shown below:

In the claims

Column 6, Line 4           Delete: "intermediate based"
Claim 6                    Insert: --intermediate points based--

Column 7, Line 16          Delete: "intermediate based"
Claim 16                   Insert: --intermediate points based--

Signed and Sealed this
Twenty-ninth Day of December, 2015

Michelle K. Lee
*Director of the United States Patent and Trademark Office*